(12) United States Patent
Punzalan et al.

(10) Patent No.: US 12,166,050 B2
(45) Date of Patent: Dec. 10, 2024

(54) RELIABLE SEMICONDUCTOR PACKAGES

(71) Applicant: UTAC Headquarters Pte. Ltd., Singapore (SG)

(72) Inventors: Jeffrey Punzalan, Singapore (SG); Il Kwon Shim, Singapore (SG)

(73) Assignee: UTAC Headquarters Ptd Ltd., Singapore (SG)

( * ) Notice: Subject to any disclaimer, the term of this patent is extended or adjusted under 35 U.S.C. 154(b) by 357 days.

(21) Appl. No.: 17/478,978

(22) Filed: Sep. 20, 2021

(65) Prior Publication Data

US 2022/0093664 A1 Mar. 24, 2022

Related U.S. Application Data

(60) Provisional application No. 63/086,039, filed on Sep. 30, 2020, provisional application No. 63/080,782, filed on Sep. 20, 2020.

(51) Int. Cl.
| | |
|---|---|
| *H01L 27/146* | (2006.01) |
| *H01L 21/56* | (2006.01) |
| *H01L 23/00* | (2006.01) |
| *H01L 23/31* | (2006.01) |

(52) U.S. Cl.
CPC ........ *H01L 27/14618* (2013.01); *H01L 21/56* (2013.01); *H01L 23/3185* (2013.01); *H01L 24/32* (2013.01); *H01L 24/83* (2013.01); *H01L 27/14632* (2013.01); *H01L 27/14636* (2013.01); *H01L 27/14687* (2013.01); *H01L 24/48* (2013.01); *H01L 24/73* (2013.01); *H01L 2224/32225* (2013.01); *H01L 2224/48225* (2013.01); *H01L 2224/73265* (2013.01)

(58) Field of Classification Search
None
See application file for complete search history.

(56) References Cited

U.S. PATENT DOCUMENTS

| | | | | |
|---|---|---|---|---|
| 6,492,699 | B1 * | 12/2002 | Glenn | H01L 27/14618 257/434 |
| 6,995,462 | B2 * | 2/2006 | Bolken | H01L 27/14687 257/680 |
| 7,745,897 | B2 * | 6/2010 | Tan | H01L 27/14683 257/434 |
| 8,164,191 | B2 | 4/2012 | Nakamura | |
| 2008/0079105 | A1 * | 4/2008 | Chang | H01L 27/14683 257/434 |
| 2008/0105941 | A1 * | 5/2008 | Chang | H01L 24/97 257/E31.117 |
| 2009/0166784 | A1 * | 7/2009 | Honda | H01L 27/14618 257/432 |
| 2009/0166831 | A1 * | 7/2009 | Chang | H01L 24/97 257/680 |
| 2021/0193483 | A1 * | 6/2021 | Shim | H01L 27/14618 |

\* cited by examiner

*Primary Examiner* — Hung K Vu
(74) *Attorney, Agent, or Firm* — HORIZON IP PTE LTD.

(57) ABSTRACT

A semiconductor package and a method of manufacturing thereof is disclosed. The package includes a package substrate having a die attach region with a die attached thereto. A protective cover with a cover adhesive is disposed over a sensor region of the die and attached to the die by the cover adhesive. The cover adhesive is disposed in a cap bonding region of the protective cover.

20 Claims, 18 Drawing Sheets

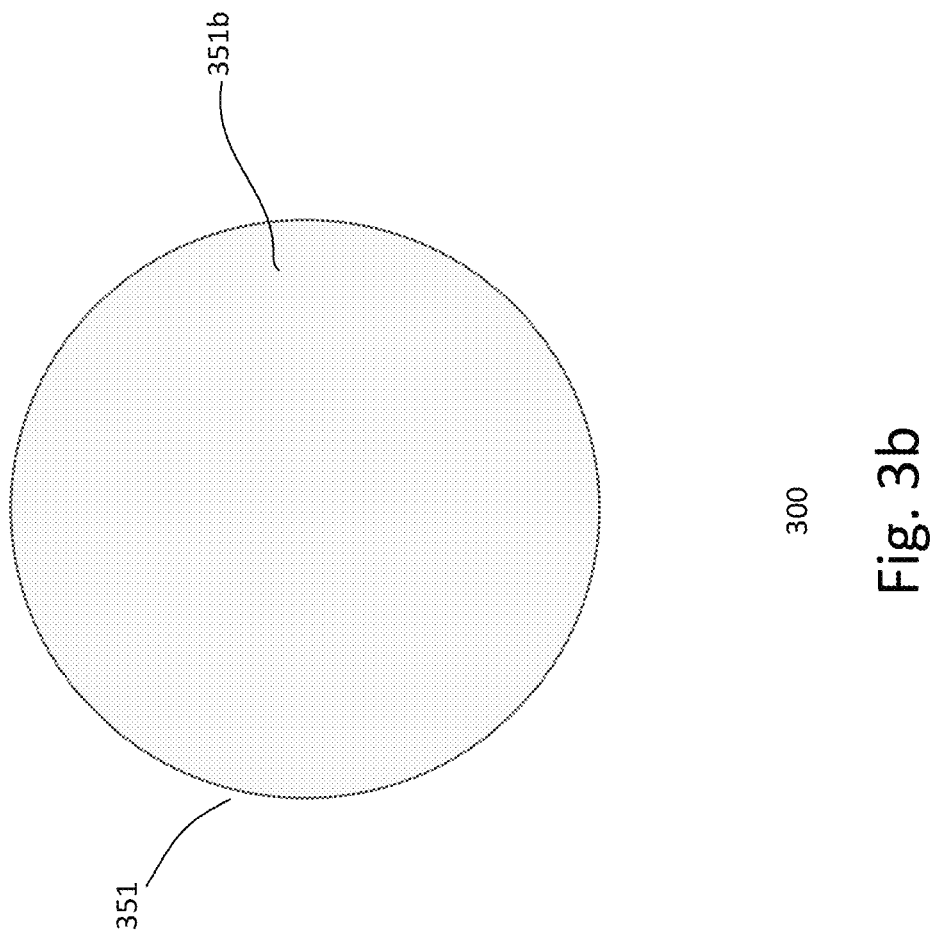

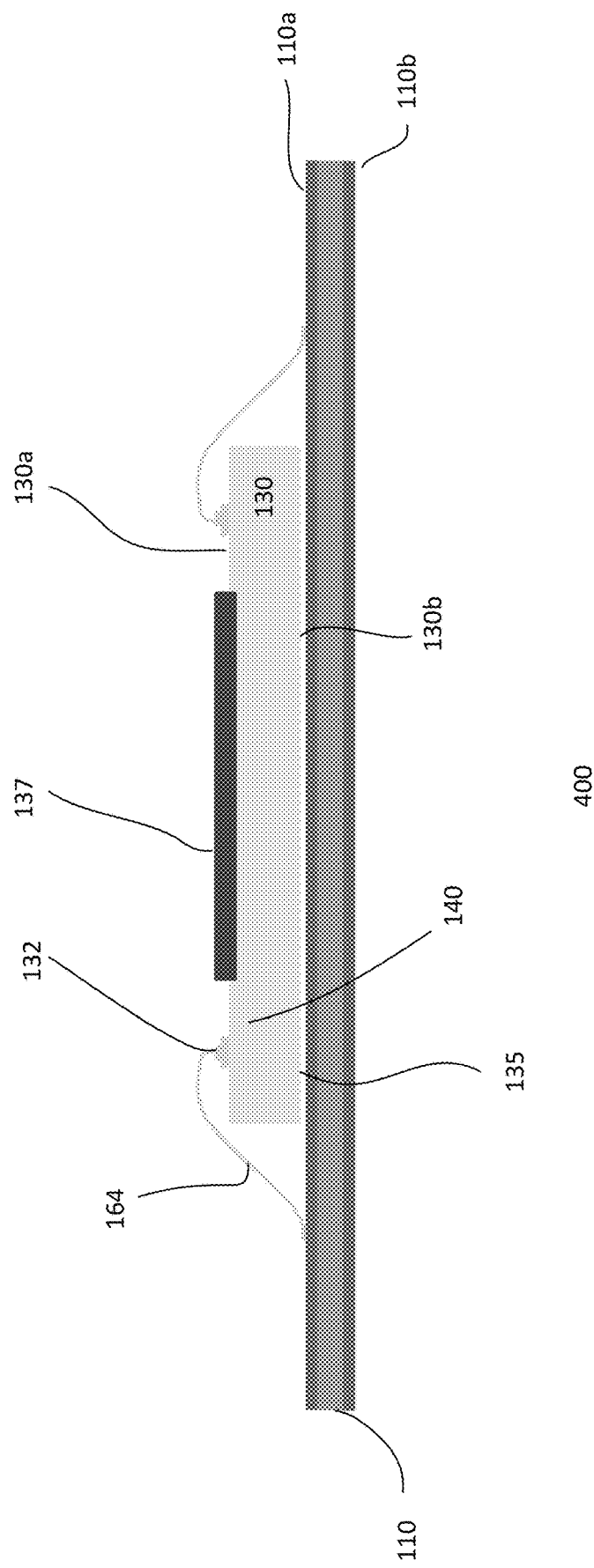

RELIABLE SEMICONDUCTOR PACKAGES

CROSS-REFERENCE TO RELATED APPLICATION

This application claims the benefit of U.S. Provisional Application No. 63/080,782, filed on Sep. 20, 2020, and U.S. Provisional Application No. 63/086,039, filed on Sep. 30, 2020, which are incorporated herein by reference in their entireties for all purposes. This application cross-references to co-pending U.S. patent application Ser. No. 17/480,090, filed on Sep. 20, 2021, which claims the benefit of U.S. Provisional Application No. 63/086,039, filed on Sep. 30, 2020, and U.S. Provisional Application No. 63/080,782, filed on Sep. 20, 2020, the disclosure of which is herein incorporated by reference in their entireties for all purposes.

FIELD OF THE INVENTION

The present disclosure relates to semiconductor packages and the manufacturing method of such packages. In particular, the present disclosure relates to semiconductor packages for sensor chips. More specifically, the present disclosure relates to semiconductor packages for image sensor chips.

BACKGROUND

Sensing devices generally include sensor chips used for receiving non-electrical signals from the surrounding environment. A sensor chip converts the non-electrical signals received into electrical signals that are transmitted to a printed circuit board. For example, an image sensor chip converts incoming light into an electrical signal that can be viewed, analyzed, or stored. Image sensors may be used in electronic imaging devices of both analog and digital types, which include digital cameras, camera modules and medical imaging equipment. Most commonly used image sensors may include semiconductor charge-coupled devices (CCD) or active pixel sensors in complementary metal-oxide-semiconductor (CMOS) or N-type metal-oxide-semiconductor (NMOS, Live MOS) technologies.

Typically, a transparent cover is provided over the sensor area of the image sensor die. For example, an adhesive is employed to attach the cover to the die. However, the adhesive has a tendency to bleed to the active or sensor area, and/or even the non-active area of the package when the cover is attached. This not only increases the risk of optical failure, but also affects reliability of the package. Moreover, reliability of the package can be compromised when an encapsulant bleeds over the exposed top surface of the cover during encapsulation.

Therefore, from the ongoing discussion, there is a desire to improve the package reliability and performance by preventing contaminations on undesired areas of the package during packaging.

SUMMARY

Embodiments generally relate to semiconductor packages and methods for forming semiconductor packages.

In one embodiment, a device includes a package substrate having top and bottom major package surfaces and the top major package surface includes a die attach region. The device further includes a die having a second major die surface attached to the die attach region and a first major die surface of the die includes a sensor region. The device also includes a protective cover having top and bottom cover surfaces. The bottom cover surface includes a cap adhesive region. The device further includes a cover adhesive disposed on the cap adhesive region on the bottom cover surface of the protective cover. The protective cover is attached to the die by the cover adhesive with the bottom cover surface facing the die. The protective cover forms a cavity over the sensor region.

In another embodiment, a method for forming a semiconductor package includes providing a package substrate having top and bottom major package surfaces and the top major package surface includes a die attach region. The method also includes attaching a second major die surface of a die onto the die attach region and a first major die surface of the die includes a sensor region. The method further includes attaching a protective cover having top and bottom cover surfaces onto the die with the bottom cover surface facing the die. The bottom cover surface includes a cap adhesive region. A cover adhesive is disposed on the cap adhesive region on the bottom surface. The protective cover is attached onto the die by the cover adhesive. The protective cover forms a cavity over the sensor region.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of various embodiments. In the following description, various embodiments of the present disclosure are described with reference to the following, in which:

FIGS. 3a to 3d show an exemplary process of forming an embodiment of a cover of a semiconductor package;

FIGS. 4a to 4e show an exemplary process of forming an embodiment of a semiconductor package;

DETAILED DESCRIPTION

Embodiments described herein generally relate to semiconductor packages and methods for forming a semiconductor package. In some embodiments, the semiconductor package includes a sensor chip used for sensing environmental signals, such as optical signals, audio signals, or the like. The semiconductor package includes a cover over the sensor chip. The semiconductor package may include other types of chips with a cover thereover. The semiconductor package may be incorporated into electronic devices or equipment, such as sensing devices, navigation devices, telecommunication devices, computers and smart devices.

Figure 1A:
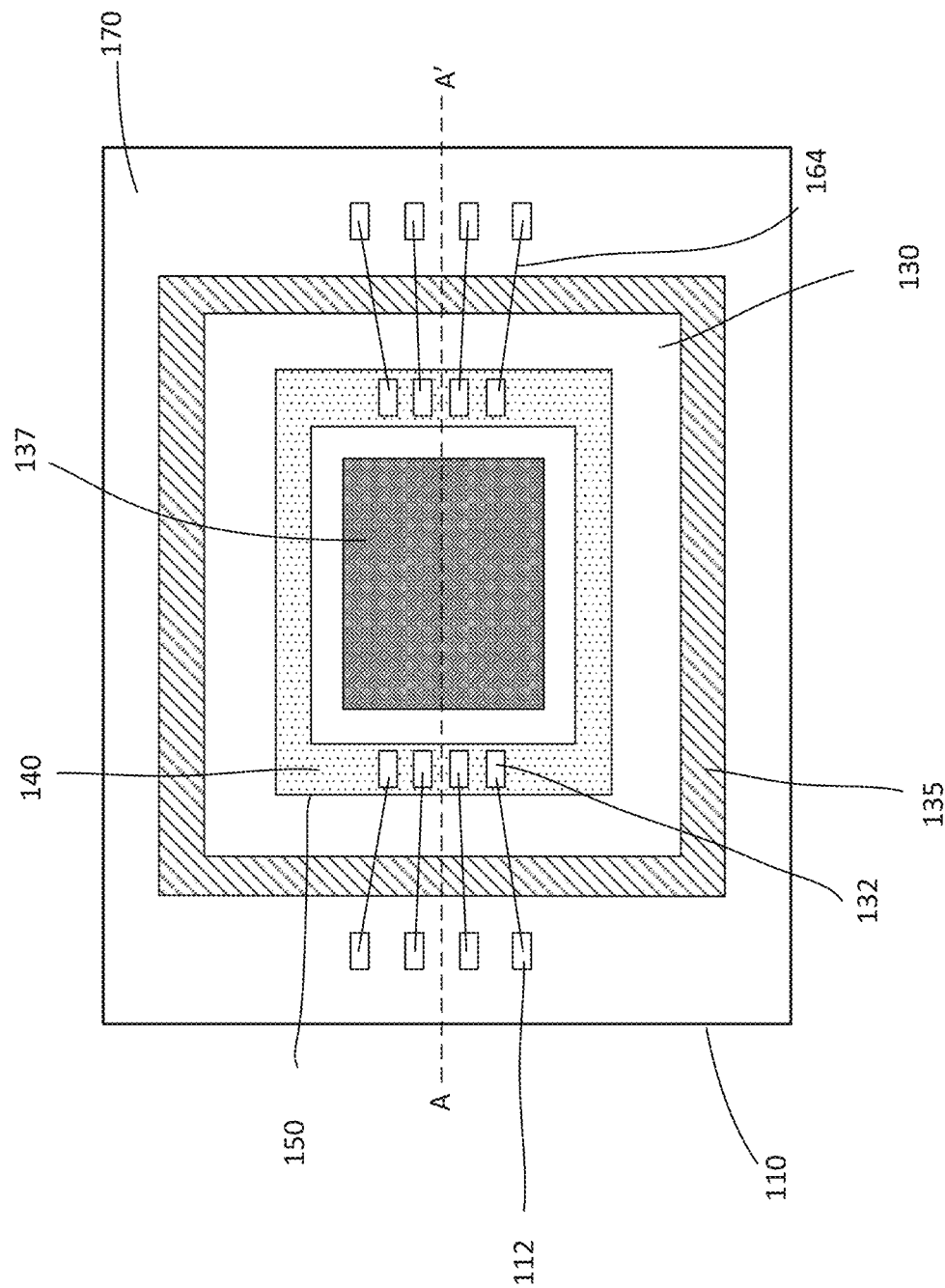
FIGS. 1a to 1c show top and side cross-sectional views of various embodiments of a semiconductor package.
Figure 1B:
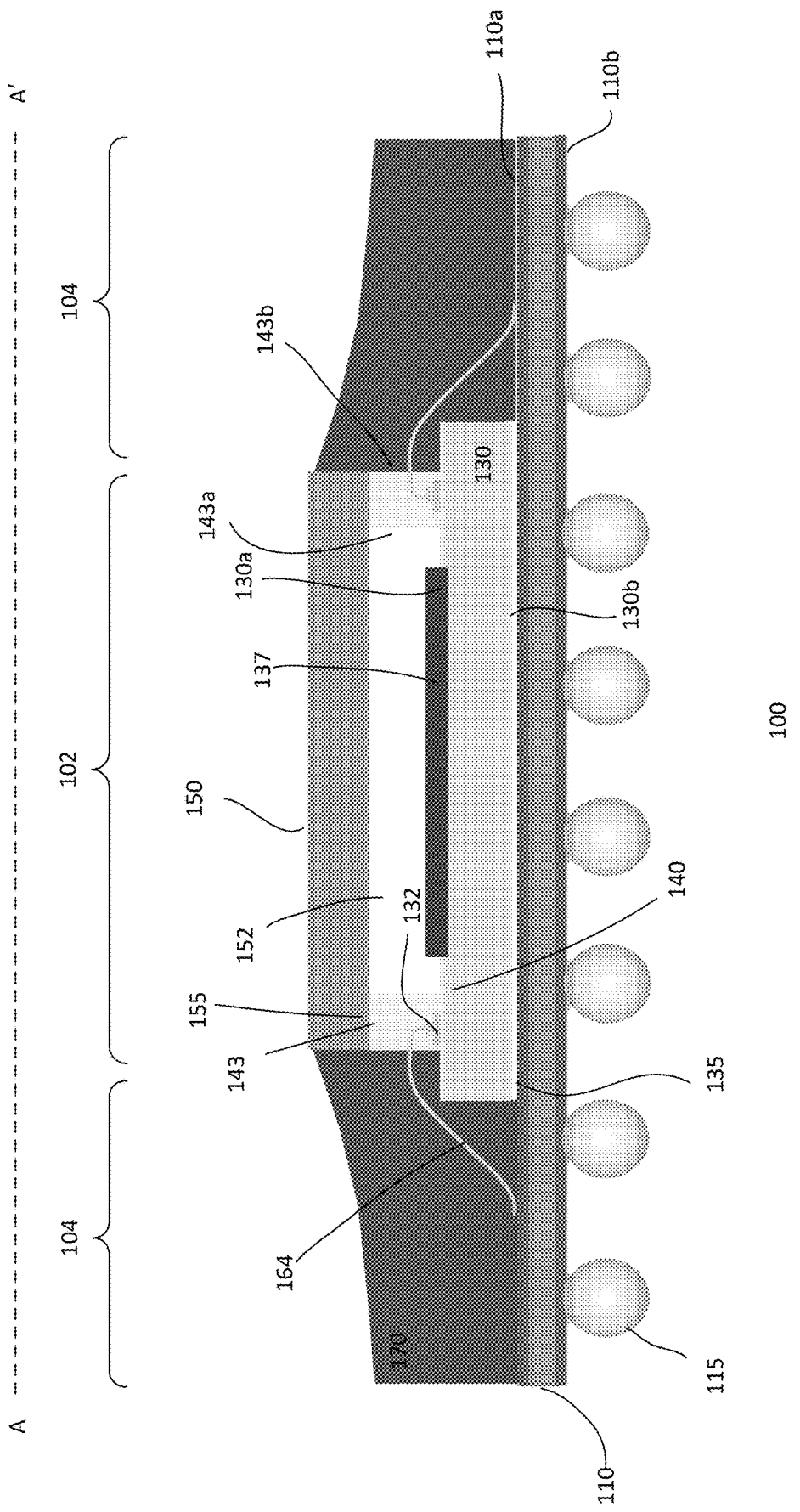
Figure 1C:
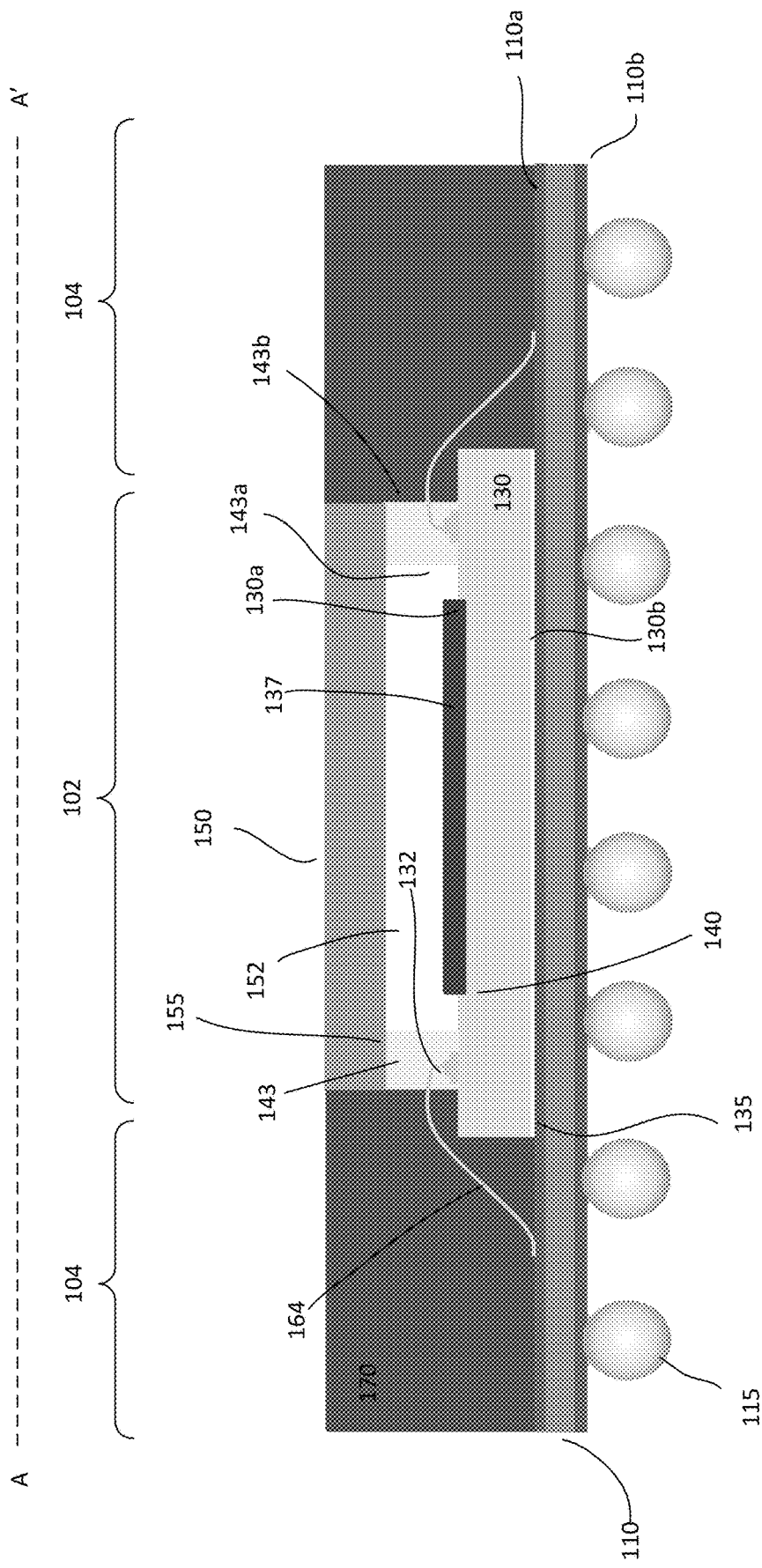

FIGS. 1a to 1c show top and side cross-sectional views of various embodiments of a semiconductor package 100. In particular, FIG. 1a shows a top cross-sectional view of a semiconductor package 100 with a protective cover, and FIGS. 1b to 1c show cross-sectional views taken along the A-A' of the semiconductor package 100 packaged in different encapsulants. The various embodiments include common elements. Common elements may not be described or described in detail.

The semiconductor package 100 includes a package substrate 110 having opposing first and second major surfaces 110a and 110b. The first major surface 110a may be referred to as the top or active package surface and the second major surface 110b may be referred to as the bottom package surface. Other designations for the surfaces may also be useful.

The package substrate may be a multi-layer substrate. For example, the package substrate includes a stack of electrically insulating substrate layers. The different layers of the package substrate 110 may be laminated or built-up. In one embodiment, the package substrate 110 is a laminate-based substrate including a core or intermediate layer sandwiched between top and bottom substrate layers. Other types of substrate, including ceramic and lead frame substrates, may also be useful. It is understood that the package substrate 110 may have various configurations, depending on design requirements.

The top package surface of the package substrate may be defined with die and non-die regions 102 and 104. The non-die region 104, for example, surrounds the die region 102. For example, the die region may be centrally disposed within the top package surface of the package substrate with the non-die region surrounding it. Providing a die region which is not centrally disposed within the top package surface may also be useful. The die region includes a die attach region for a die to be mounted thereto.

The top package surface of the package substrate may include package bond pads. In some embodiments, the top package surface of the package substrate includes package bond pads 112 disposed in the non-die region 104. For example, the package bond pads are disposed outside of the die attach region. The bottom package surface may include package contacts 115. The package contacts, for example, are spherical-shaped structures or balls protruding from the bottom package surface. Other types of package contacts may also be possible. The package contacts may be formed of a conductive material such as a solder material. Various types of solder can be used to form the package contacts. For example, the solder can be a lead-based or non lead-based solder. Other suitable types of conductive materials may also be used to form the package contacts. The package contacts are configured to electrically couple to the package bond pads on the top package surface of the package substrate. For example, each package contact is coupled to its respective package bond pad. The package substrate may include one or more conductive layers embedded therein. The conductive layers may form interconnect structures including conductive traces and contacts for interconnecting the package contacts to package bond pads.

A die 130 is attached to the die attach region of the top package surface of the package substrate. The die, for example, includes first and second opposing major die surfaces 130a and 130b. The first major die surface may be referred to as a top or active die surface and the second major die surface may be referred to as a bottom or inactive die surface.

The die 130, as shown, is attached to the die attach region of the package substrate by a die adhesive 135. The adhesive may be a curable glue or adhesive tape. For example, a curing process may be performed to permanently attach the die to the die region. Other types of die adhesives may also be useful to attach the die to the die region. The bottom die surface 130b of the die, for example, contacts the die attach region. For example, the inactive die surface contacts the die attach region of the package substrate.

In one embodiment, the active die surface 130a includes a sensor region 137. For example, the die is a sensor chip. Other types of dies may also be useful. For example, the die may be a thermal or infrared (IR) image sensor chip. Other types of chips, for example, non-sensor chips, may also be useful. In the case of an image sensor chip, the sensor region may include a photosensitive sensor that may capture image information in response to light. The image sensor may be, for example, a CMOS or CCD type image sensor. In one embodiment, the sensor region includes an array of sensors. For example, each sensor may correspond to a pixel of an image. The sensor chip may include CMOS components embedded in the chip for controlling the sensor chip. Other configurations of the sensor chips may also be useful.

The active die surface 130a may include die bond pads 132 disposed outside of the sensor region. For example, the die bond pads may be disposed on the non-sensor region of the active surface of the die. The die bond pads are exposed by openings formed in a top passivation layer of the die. The surfaces of the die bond pads, for example, are substantially coplanar with the active surface of the die. Providing die bond pads with surfaces which are not coplanar with the active die surface may also be useful. The die bond pads provide external electrical connections to various components of the die. A conductive material, such as copper (Cu), aluminum (Al), Gold (Au), Silver (Ag), Nickel (Ni), solder material, or the alloys of these materials, or a combination thereof, may be used to form the die bonds pads. Other types of conductive material may also be useful. As shown, the die bond pads may be arranged into one or more rows disposed on the active surface of the die. Other arrangements of the die bond pads may also be useful.

In one embodiment, a plurality of wire bonds 164 is provided to electrically connect the die bond pads 132 on the active surface of the die to the package bond pads 112 on the top package surface of the package substrate. The wire bonds enable external connection to the internal circuitry of the die. The wire bonds, for example, may be formed of any suitable metal material such as, but not limited to, Cu, Au, Ag, Al, or the alloys of these materials, or a combination thereof. Other types of conductive materials may also be used. The wire bonds 164 create electrical connection between the interconnect structures (e.g., bond pads, conductive traces, via contacts, terminal pads) of the package substrate 110 and the semiconductor die 130.

A protective cover or cap 150 is disposed on the active surface of the die 130 over the sensor region 137. The protective cover includes first or top and second or bottom opposing cover surfaces with sides or edges. The bottom cover surface, for example, is facing the die. The protective cover, for example, may be a glass cover which enables light to penetrate to the sensor region. Other types of protective covers may also be useful. For example, the protective cover may depend on the type of sensor. The protective cover is larger than the sensor region, enabling it to be disposed thereover and to form a hermetically sealed cavity 152 to protect the sensor region from the external environment. For example, the protective cover serves as a cap over the sensor region. As shown, the protective cover has a rectangular shape. Providing a protective cover with other shapes may also be useful.

In one embodiment, the active die surface includes a die adhesive region 140. The die adhesive region 140, as shown, surrounds the sensor region 137. In one embodiment, the die adhesive region encompasses the die bond pads 132. Providing other configurations of the die adhesive region and die bond pads may also be useful. For example, the die adhesive region may be disposed between the die bond pads and the edges of the die or between the die bond pads and the sensor region.

As for the protective cover, it includes a cap adhesive region 155 on the bottom surface thereof. A cover adhesive 143 is disposed on the cap adhesive region. In one embodiment, the cap adhesive region is disposed on the periphery of the bottom surface of the protective cover. For example, the cap adhesive region extends inwardly from the edges of the bottom surface of the protective cover. In the case of a rectangular-shaped protective cover, there are 4 edges (e.g., 2 edges in the length direction and 2 edges in the width direction). The cap adhesive region may be a rectangular ring-shaped region which extends inwardly form the edge of the bottom surface of the protective cover. Providing the cap adhesive region on the periphery of the bottom surface maximizes surface area for the sensor region without increasing the size of the protective cover, facilitating a compact package footprint.

The cover adhesive 143 contacts the die adhesive region on the active die surface. The cover adhesive and the protective cover form a hermetically sealed cavity 152 surrounding the sensor region. As shown, the cover adhesive covers the die bond pads and a portion of the wire bonds 164. The cover adhesive may be a curable adhesive. For example, the adhesive may include epoxy, acrylic, polyimide, urethane, thiol, or a combination thereof. In one embodiment, the adhesive has high transparency and a high refractive index. Other types of or configurations, such as transparency and high refractive index, of adhesives may also be useful, depending on the desired refractive index of the protective cover. A curing process may be performed to permanently attach the protective cover to the die to form the hermetically sealed cavity.

In one embodiment, the cover adhesive disposed on the protective cover is aligned to the edges thereof. For example, outer adhesive walls 143b (e.g., adhesive walls which faces away from the sensor region) of the cover adhesive is aligned to the edges of the protective cover. A width of the cover adhesive between the outer adhesive walls 143b and the inner adhesive walls 143a may be about 200-250 um. Other widths for the cover adhesive may also be useful. As for the height of the cover adhesive, it may be about 80-90 um. Other heights for the cover adhesive may also be useful. The height of the cover adhesive defines the height of the cavity between the cover and die active surface.

In one embodiment, alignment of the cover adhesive to edges of the protective cover may be achieved by, for example, forming a patterned adhesive film onto a cover panel or wafer which is used to form a plurality of protective covers. The cover wafer is cut or sawed to singulate it into individual protective covers. The patterned adhesive film, for example, may have a grid pattern which serves as the cover adhesives for adjacent edges of adjacent protective covers. When sawed, the cover adhesive is aligned to protective cover edges.

As discussed, the die bond pads 132 are disposed on the die adhesive region 140 with the cover adhesive. As such, portions of the wire bonds are covered by the protective cover. For example, when the protective cover is mounted onto the die active surface, the cover adhesive covers the die bond pads 132 and portions of the wire bonds 164. This stabilizes the wire bonds and minimizes occurrence of wire sweep. Further, such configurations advantageously reduce the footprint of the package. As also discussed, other configurations of die bond pads and wire bonds may also be useful.

When the protective cover is attached, the cover adhesive effectively prevents adhesive bleed to active die area and other areas adjacent to the die adhesive region. Alternatively, a dam structure with a predetermined height may be formed in a non-sensor region of the active die surface to prevent bleeding of adhesive. The dam structures are described in co-pending U.S. patent application Ser. No. 17/480,090, filed on Sep. 20, 2021, which claims the benefit of U.S. Provisional Application No. 63/086,039, filed on Sep. 30, 2020, and U.S. Provisional Application No. 63/080,782, filed on Sep. 20, 2020, the disclosures of which are incorporated herein by reference in their entireties for all purposes.

An encapsulant 170 is disposed on the package substrate. The encapsulant 170 covers the package substrate, exposed portions of the die and sides of the protective cover 150. For example, the encapsulant is configured to adhere to the sides of the protective cover while leaving the top of the protective cover exposed. For example, the encapsulant 170 extends into the non-die region 104 of the semiconductor package 100 to cover the exposed top surface of the package bond pads in the top package surface 110a. The encapsulant may be formed using ceramic, plastic, epoxy, or a combination thereof. Providing other materials to form the encapsulant may also be useful.

In one embodiment, as shown in FIG. 1b, the topmost surface of the encapsulant 170 may be formed slightly below the top surface of the protective cover 150 and slopes downwardly from the protective cover towards a perimeter of the non-die region 104. For example, a liquid encapsulant is used. Alternatively, as shown in FIG. 1c, the encapsulant 170 may be formed with vertical sidewalls and a substantially planar top surface that is about level with the top surface of the protective cover 150. For example, the encapsulant is a solid mold compound. The encapsulant provides a rigid and mechanically strong structure to protect the sensor region from the environment. For example, the encapsulant protects the sensor region from moisture and provides the protective cover with mechanical support.

Figure 2B:
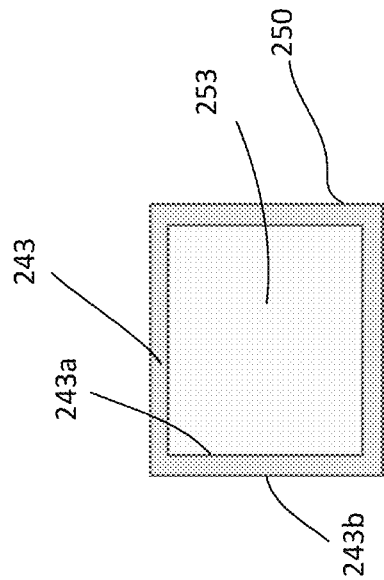
FIGS. 2a-2b show top and side cross-sectional views of an embodiment of a cover of a semiconductor package.
Figure 2A:
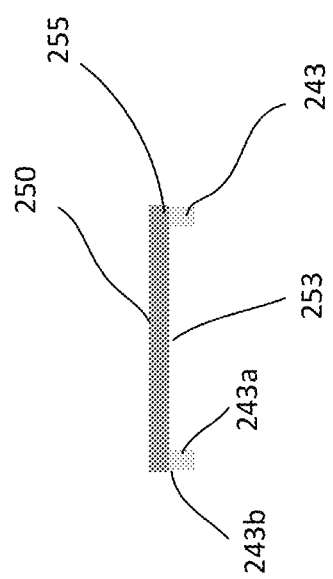

FIGS. 2a to 2b show side cross-sectional and bottom views of an embodiment of a cover of a semiconductor package 200. In particular, FIG. 2a shows a side cross-sectional view of the cover, and FIG. 2b shows a bottom view of the cover. The cover of FIGS. 2a to 2b is similar to those shown in FIGS. 1a to 1c. Common elements may not be described or described in detail.

As shown, the protective cover 250 includes a cap adhesive region 255 on the bottom surface of the protective cover. For example, the cap adhesive region is disposed at a periphery of the bottom surface of the protective cover. The cap adhesive region extends inward from the edges of the protective cover. In the case of a rectangular-shaped protective cover, there are 4 edges (e.g., 2 edges in the length direction and 2 edges in the width direction). The cap adhesive region may be a rectangular ring-shaped region which extends inwardly from the edge of the bottom surface of the protective cover. The cover adhesive is disposed in the cap adhesive region of the protective cover. For example, when the cover adhesive is formed on the protective cover, side edges of the cover adhesive are aligned with the side edges of the protective cover. This advantageously provides for a package design with a smaller footprint. The cover adhesive has opposing top and bottom surfaces and opposing vertical first and second adhesive walls 243a-b. The top surface of the cover adhesive is disposed on the cap adhesive region on the bottom surface of the protective cover. The second or outer adhesive walls of the cover adhesive 243b are aligned with the outer edges the protective cover. A width of the cover adhesive between the outer adhesive walls 243b and the inner adhesive walls 243a may be about 200-250 um. Other widths for the cover adhesive may also be useful. The cover adhesive has a height which forms the cavity over the sensor region. The height of the cover adhesive may be about 80-90 um. Other configurations of the cover adhesive may also be useful. The cover adhesive creates an opening 253 defined within the first or inner adhesive walls of the cover adhesive 243a. The opening corresponds to the cavity over the sensor region when the protective cover is attached onto the die. As discussed, the protective cover with the cover adhesive may be formed by singulating a cover wafer laminated with a patterned adhesive film, or a cover wafer dispensed with a liquid adhesive with the desired pattern.

FIGS. 3a to 3d show an exemplary process of forming an embodiment of a protective cover of a semiconductor package 300. The protective cover of the semiconductor package is similar to those described in FIGS. 1a to 1c and FIGS. 2a to 2b. Common elements may not be described or described in detail.

Figure 3A:
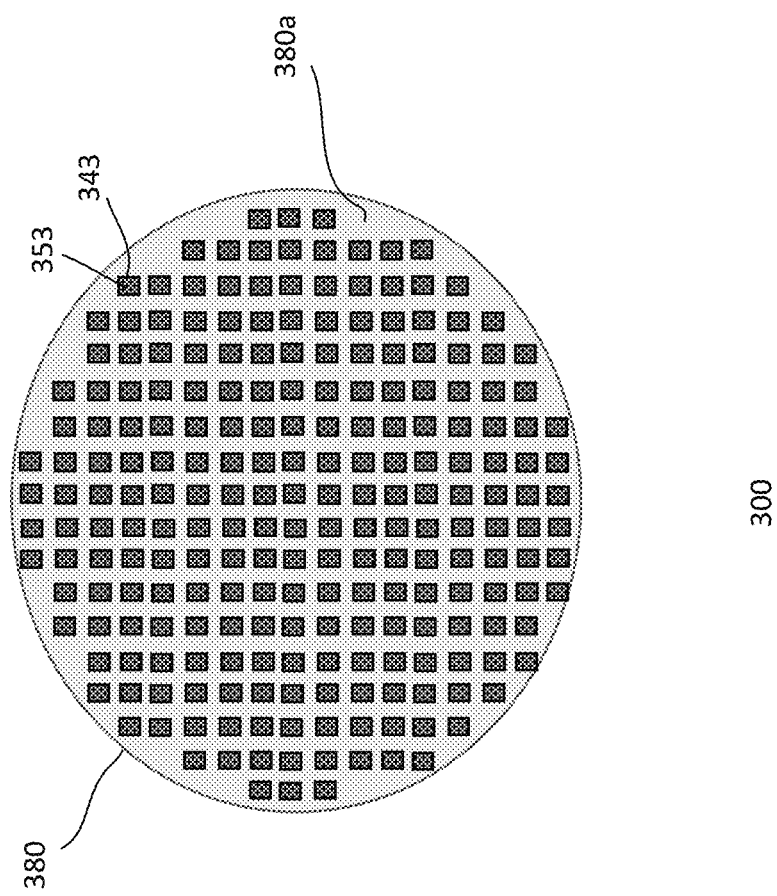

As shown in FIG. 3a, the process commences at providing an adhesive film with a plurality of openings 380. For example, the adhesive film 380 includes a plurality of adhesive structures with openings 353. The adhesive structures 353 are arranged into rows and columns along first or x and second or y directions on first or front film surface 380a. The adhesive structure 353 may be a rectangular ring-shaped structure having an opening 343 defined within the ring. For example, the opening is defined within the first or inner adhesive walls of the ring structure. The openings are configured with a dimension corresponding to the sensor region of the die. For example, the openings are configured to be larger than the footprint of the sensor region to create the cavity.

Figure 3C:
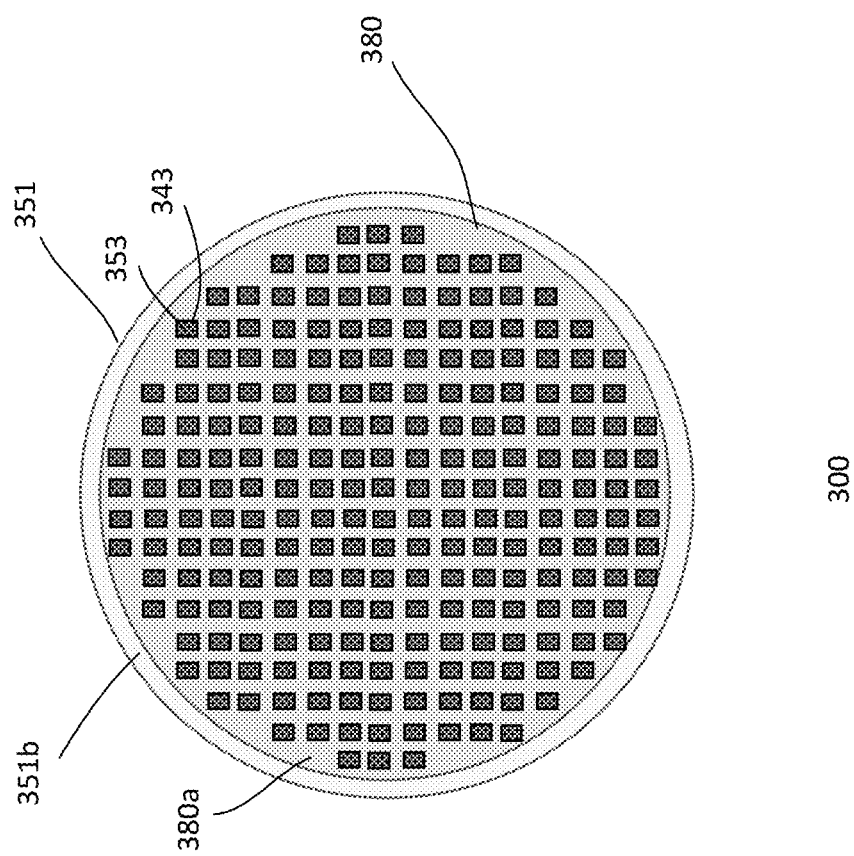

A cover substrate 351 is provided in FIG. 3b. For example, the cover substrate may be a glass wafer including first or active substrate surface and second or inactive substrate surface 351b. The adhesive film may be laminated onto the inactive substrate surface of the glass wafer, as shown in FIG. 3c. For example, second or back film surface of the adhesive film is laminated onto the second or inactive substrate surface of the glass wafer 351b. For example, the adhesive film with openings is laminated onto the cover substrate by a lamination machine. The lamination machine may have an alignment system to align the adhesive film with openings to the cover substrate. For example, the alignment system is a vision system configured to detect alignment marks prepared on the adhesive film and cover substrate. The alignment marks of the adhesive film may be the openings of the adhesive film. Other configurations of the alignment marks may also be useful. The adhesive film with openings is laminated onto the glass wafer when the alignment marks of the adhesive film correspond to the alignment marks of the cover adhesive.

Figure 3D:
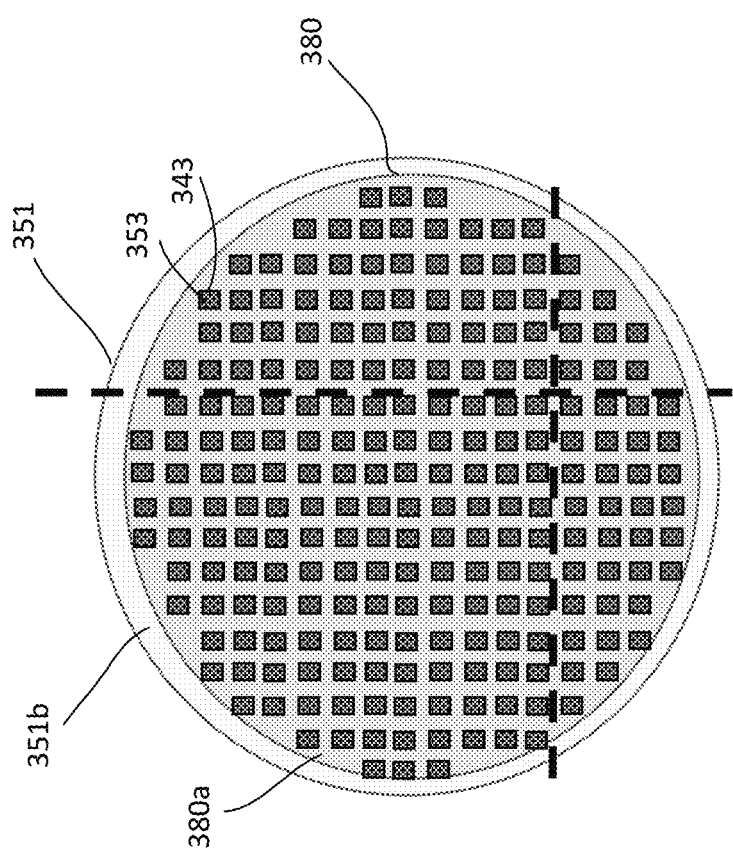

In FIG. 3d, the cover substrate with the adhesive film is singulated, for example, diced or mechanical sawed, forming a plurality of protective covers with the cover adhesive. The cover adhesive is aligned to edges of the protective cover.

Alternatively, a liquid adhesive may be dispensed onto a cover substrate, such as a glass wafer having first or active and second or inactive wafer surfaces, with a desired pattern. For example, the liquid adhesive is dispensed onto the inactive wafer surface in a plurality of rectangular ring-shaped structures along first or x and second or y directions, forming a plurality of adhesive structures with openings in rows and columns. As discussed, the openings are configured with a dimension corresponding to the sensor region of the die. For example, the openings are configured to be larger than the footprint of the sensor region to create the cavity. A curing process may be employed to cure the liquid adhesive. The cover substrate with the cured adhesive is singulated thereafter, forming a plurality of protective covers with the cover adhesive. Other techniques for forming the protective covers with the cover adhesive, such as screen printing, may also be useful.

FIGS. 4a-4e show an exemplary process 400 of forming an embodiment of a semiconductor package. The package, for example, is similar to those described in FIGS. 1a to 1c. Common elements may not be described or described in detail.

The process flow 400, for example, commences at providing a package substrate 110. The package substrate may include top and bottom package surfaces 110a and 110b. The top package surface of the package substrate may include a die attach region and package bond pads disposed outside of the die attach region.

A die 130 is attached to the die attach region, for example, by a die adhesive. The die adhesive may be an adhesive tape disposed on the die attach region 135. The die, for example, is temporarily attached to the die attach region. For example, a curing process may be performed to permanently attach the die to the die region. The bottom surface or inactive surface of the die 130b, for example, contacts the die attach region. In one embodiment, the active die surface 130a includes a sensor region 137. Depending on the application of the die, the sensor region may include a sensor or an array of sensors. The top or active die surface may include die bond pads 132 disposed outside of the sensor region. For example, the die bond pads may be disposed on the non-sensor region of the active surface of the die.

Wire bonds 164 are formed in FIG. 4b. The wire bonds may be formed on die bond pads disposed within a die adhesive region 140 surrounding the sensor region. Providing other arrangements for the die bond pads and the wire bonds may also be possible. For example, wire bonds may be formed on die bond pads disposed within the die adhesive region or a combination of die adhesive region and outside of the die adhesive region.

Figure 4A:
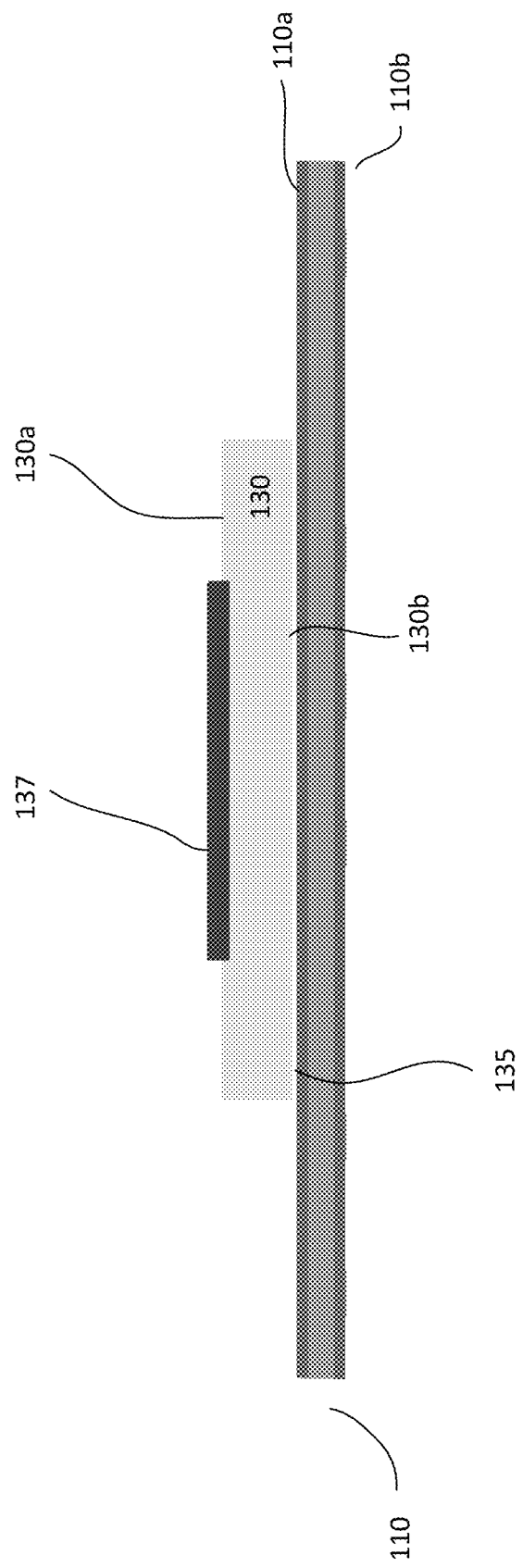
Figure 4C:
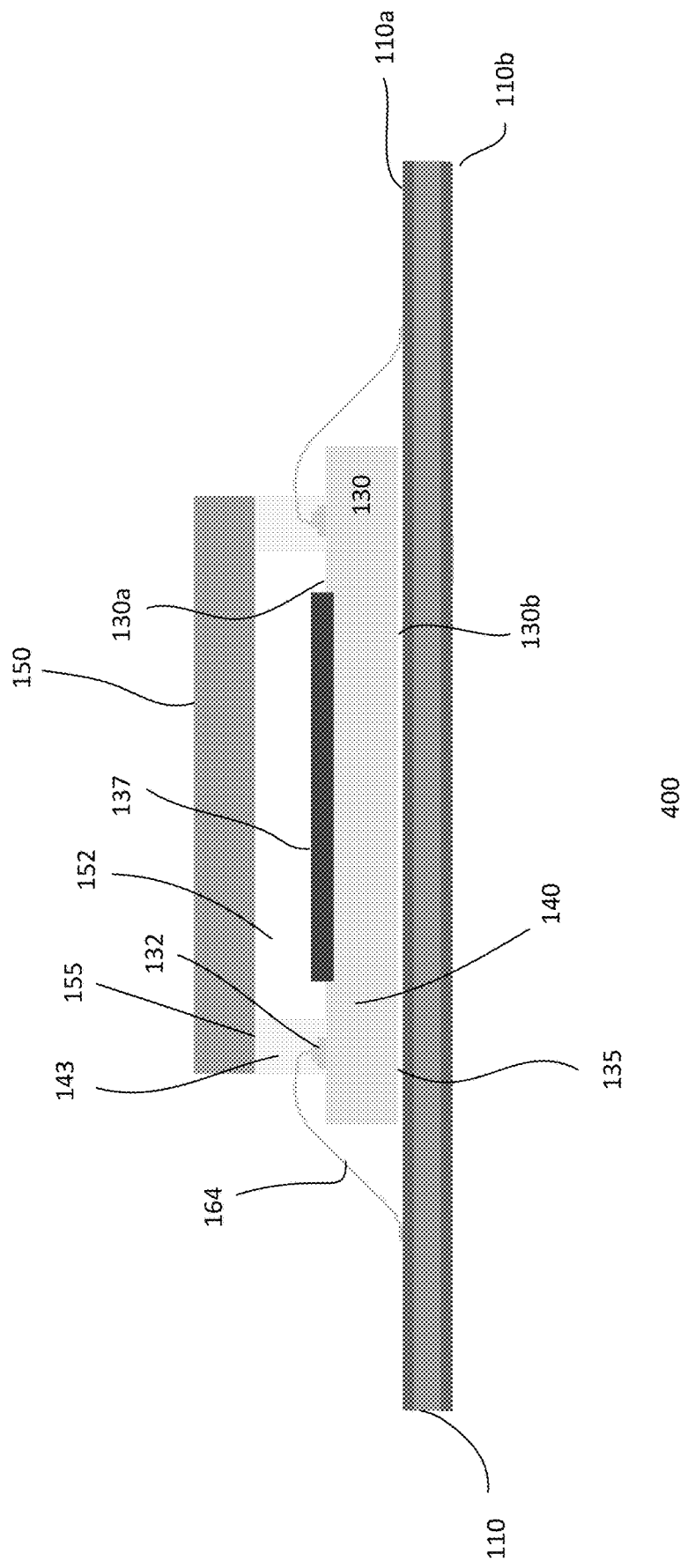

A protective cover 150 with cover adhesive 143 is attached to the die in FIG. 4c. The protective cover with cover adhesive is the same or similar to those described in FIGS. 2a to 2b, and those formed in FIGS. 3a to 3d. Common elements may not be described or described in detail. For example, the protective cover is a glass cover. Other types of protective cover may also be useful. The protective cover has top and bottom protective cover surfaces 150a and 150b. The bottom protective cover surface includes a cap bonding region 155. A cover adhesive 143 is disposed in the cap bonding region of the protective cover. The cover adhesive may be a UV curable adhesive. Other types of adhesives may also be useful. As discussed, the die active surface includes a die adhesive region for attaching the protective cover to the die. The cover adhesive has opposing top and bottom surfaces and opposing vertical first and second adhesive walls 143a-b. The top surface of the cover adhesive is disposed in the cap adhesive region of the protective cover, the bottom surface of the cover adhesive contacts the die adhesive region on the active die surface.

The second or outer adhesive walls of the cover adhesive 143b are aligned with the edges of the protective cover. A width of the cover adhesive between the outer adhesive walls 243b and the inner adhesive walls 243a may be about 200-250 um. Other widths for the cover adhesive may also be useful. The cover adhesive has a height which forms the cavity 152 over the sensor region 137. The height of the cover adhesive may be about 80-90 um. Other configurations of the cover adhesive may also be useful. The cover adhesive creates an opening defined within the first or inner adhesive walls of the cover adhesive 143a. The opening corresponds to the cavity 152 over the sensor region when the protective cover is attached onto the die. As shown, the die bond pads are disposed within the die adhesive region. In such cases, the cover adhesive is disposed on the die bond pads and portions of the wire bonds thereover.

When the protective cover with the cover adhesive is placed on the die, a curing process may be performed thereafter to prevent the cover adhesive from bleeding towards undesired areas, such as onto the sensor region of the die and/or onto the edge of the die or protective cover. A curing process such as UV curing or thermal curing may be performed thereafter to permanently attach the protective cover to the die.

Figure 4D:
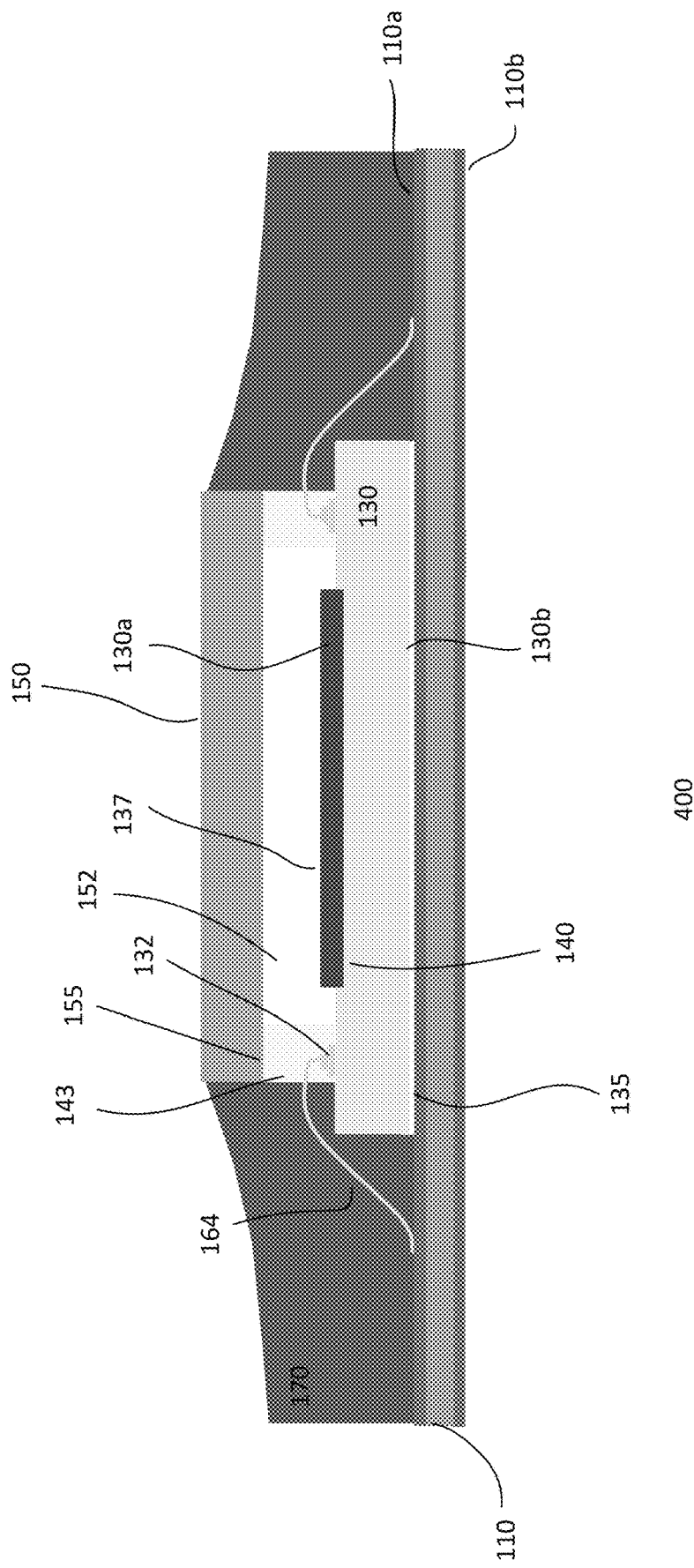

In FIG. 4d, an encapsulant, such as epoxy, is formed over the package substrate. The encapsulant covers the package substrate, exposed portions of the die and wire bonds, and sides of the protective cover. The epoxy may be formed by, for example, dispensing. Other techniques or materials may also be employed for the encapsulant. The encapsulant is cured thereafter.

Figure 4E:
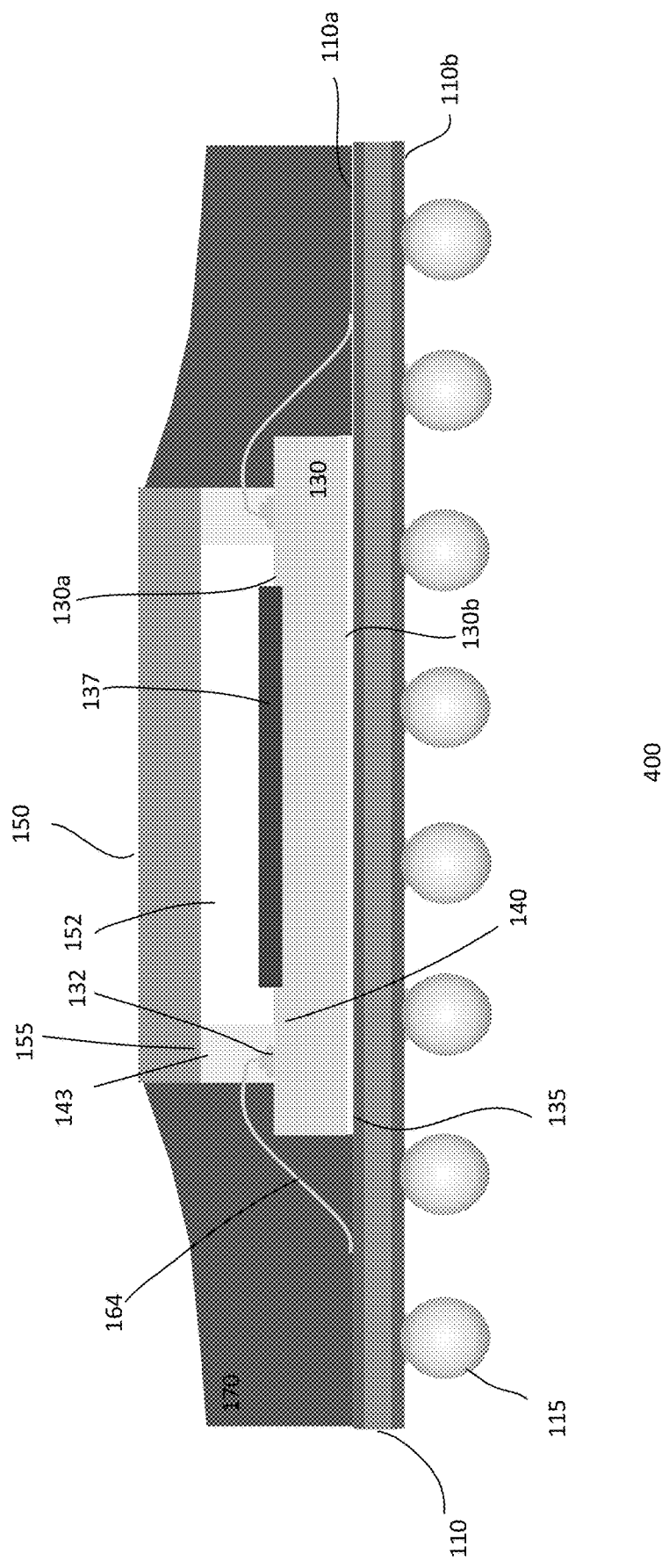

It is appreciated that the above process can be used for forming different types of packages. In some embodiments, the package can be a lead frame package. In other embodiments, the package may be a BGA type package. In such cases, a process to form the package contacts 115 may be performed after encapsulation, as shown in FIG. 4e. For example, the package contacts are formed on the bottom package surface of the package substrate. The package contacts are coupled to the package bond pads on the top package surface by, for example, one or more metal layers and via contacts embedded in the package substrate. The package contacts, for example, may include spherical-shaped structures or balls arranged in grid pattern to form a BGA type package. A conductive material may be used to form the package contacts. The package contacts, for example, can be formed from solder. Various types of solder can be used to form the package contacts. For example, the solder can be a lead-based or non lead-based solder. Forming other configurations or types of packages may also be possible.

FIGS. 5a-5e shows an exemplary process 500 of forming an embodiment of a semiconductor package. The package, for example, is similar to those described in FIGS. 1a to 1c. Common elements may not be described or described in detail.

Referring to process 500, it is similar to process 400. Common elements may not be described or described in detail. However, unlike process 400, the encapsulant 170 may be formed with vertical sidewalls and a substantially planar top surface that is about level with the top surface of the protective cover 150. For example, the encapsulant is a solid mold compound. The encapsulant provides a rigid and mechanically strong structure to protect the sensor region from the environment. For example, the encapsulant protects the sensor region from moisture and provides the protective cover with mechanical support.

Figure 5A:
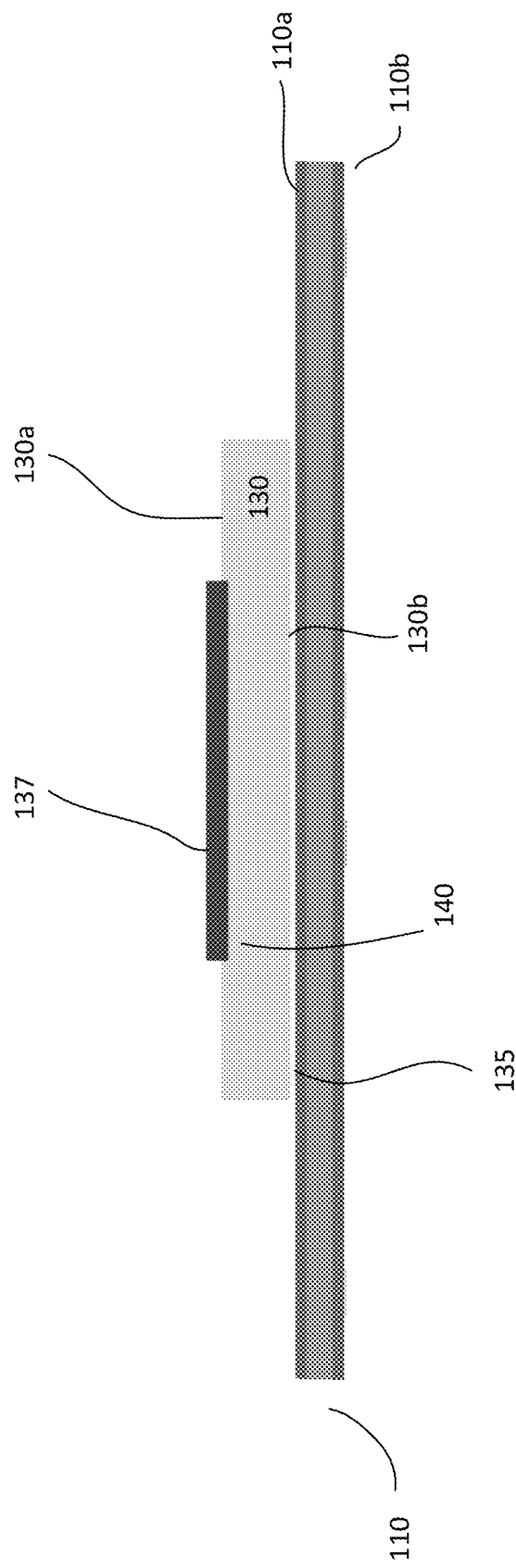
FIGS. 5a to 5e show an exemplary process of forming another embodiment of a semiconductor package.
Figure 5B:
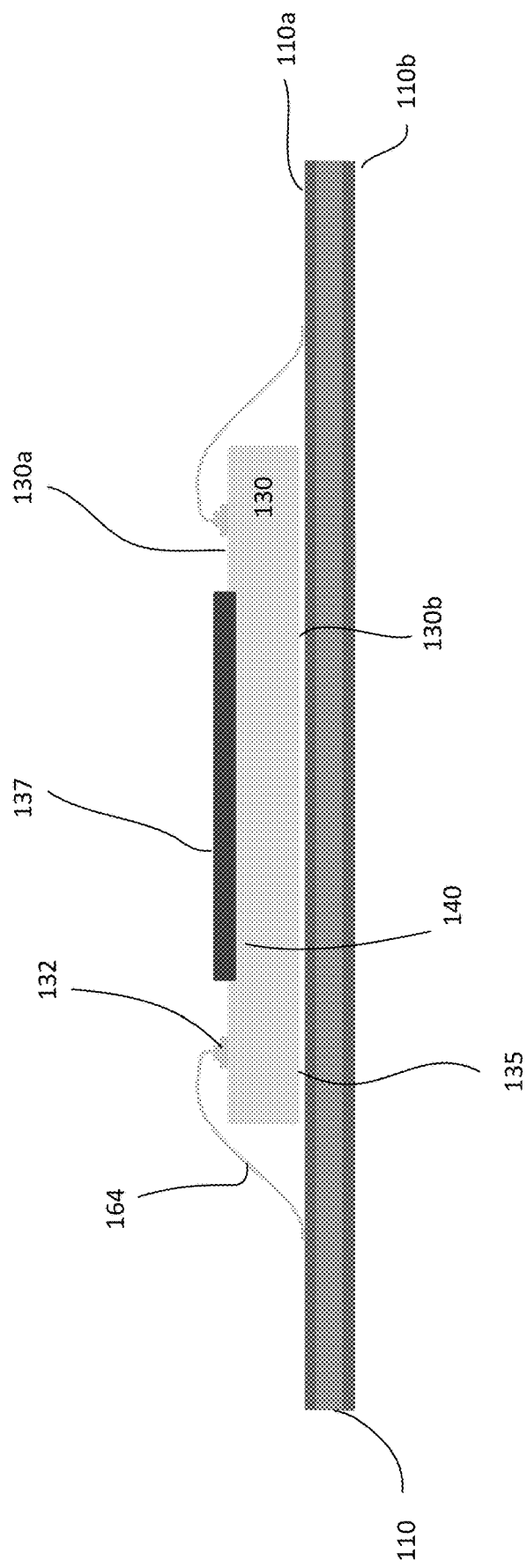
Figure 5C:
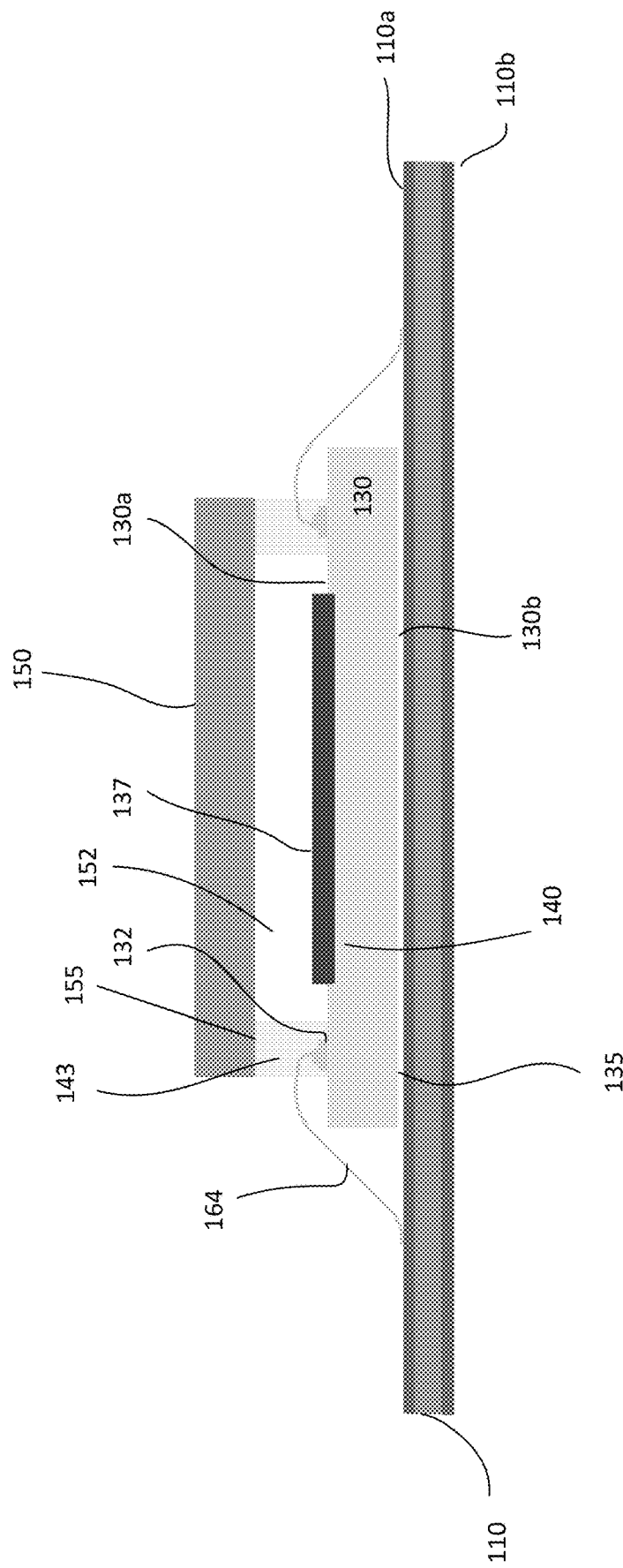
Figure 5D:
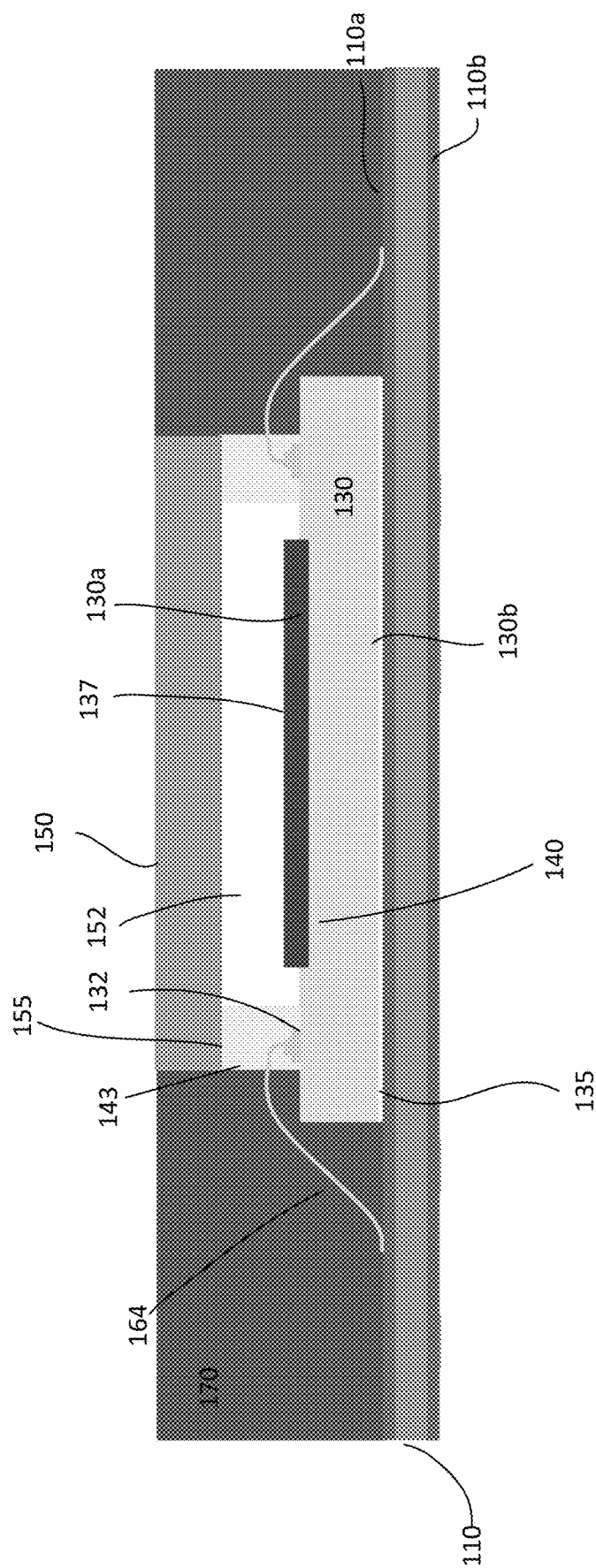
Figure 5E:
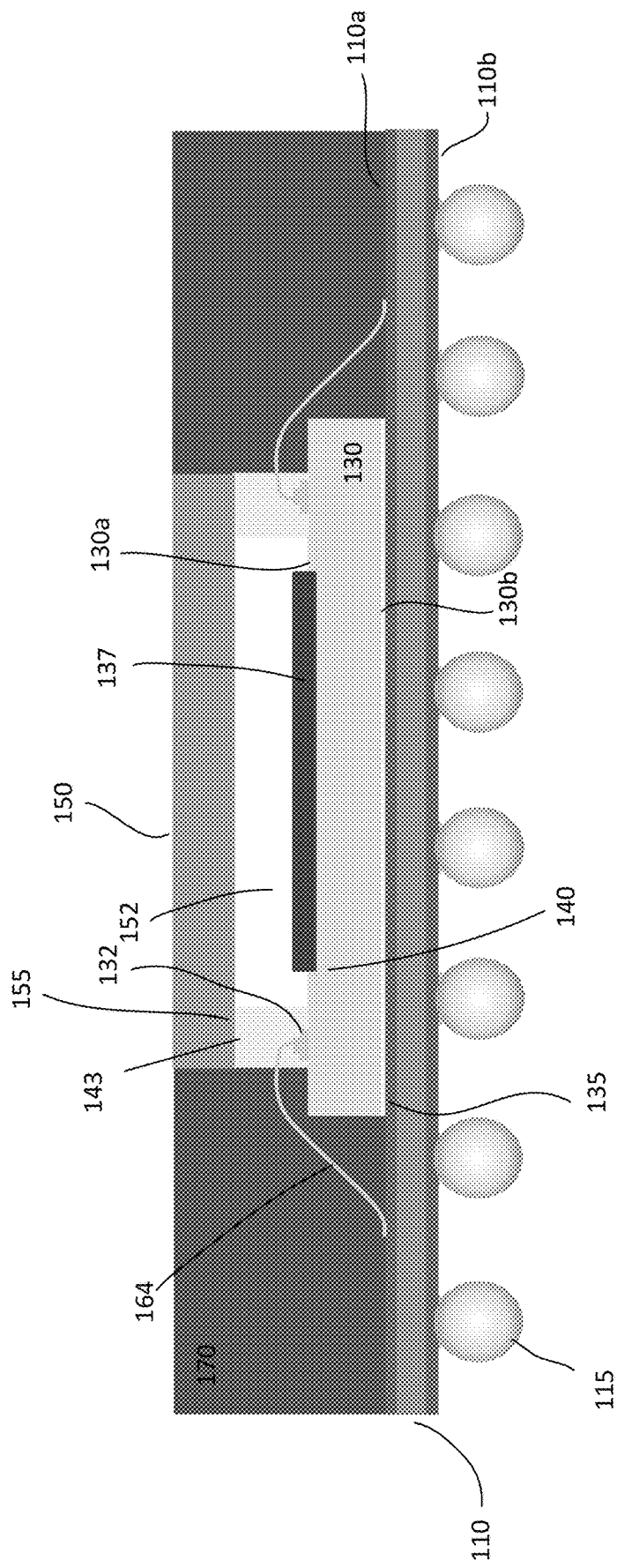

It is appreciated that the above process can be used for forming different types of packages. In some embodiments, the package can be a lead frame package. In other embodiments, the package may be a BGA type package. In such cases, a process to form the package contacts may be performed after encapsulation, as shown in FIG. 5e. For example, the package contacts are formed on the bottom package surface of the package substrate. The package contacts are coupled to the package bond pads on the top package surface by, for example, one or more metal layers and via contacts embedded in the package substrate. The package contacts, for example, may include spherical-shaped structures or balls arranged in grid pattern to form a BGA type package. A conductive material may be used to form the package contacts. The package contacts, for example, can be formed from solder. Various types of solder can be used to form the package contacts. For example, the solder can be a lead-based or non lead-based solder. Forming other configurations or types of packages may also be possible.

The inventive concept of the present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A device comprising:
  a planar package substrate having planar top and bottom major package substrate surfaces and package substrate side surfaces forming edges of the planar package substrate, the top major package surface includes a die attach region and package pads;
  a die having
    a second major die surface attached to the die attach region, and
    a first major die surface, the first major die surface includes
      a sensor region, and
      a die cover attach region surrounding the sensor region, wherein the die cover attach region includes die pads;
  wire bonds electrically connecting the die pads to the package pads;
  a protective cover having top and bottom cover surfaces separated by side cover surfaces, wherein the bottom cover surface includes a cap adhesive region at a periphery of the bottom cover surface, wherein a cover footprint of the protective cover is smaller than a die footprint of the die; and
  a cover adhesive film pre-attached onto the cap adhesive region of the protective cover, wherein the cover adhesive film includes a pattern corresponding to the cap adhesive region, wherein outer edges of the cover adhesive film are aligned with the protective side cover surfaces, the protective cover is attached to the die cover attach region of the die by the cover adhesive, the protective cover and the cover adhesive film form a cavity over the sensor region, wherein the cover adhesive encases first portions of the wire bonds over the die cover attach region while leaving second portions of the wire bonds outside of the die cover attach region which are attached to package pads exposed.

2. The device of claim 1 further comprises an encapsulant encapsulating the package substrate and side cover surfaces of the protective cover, wherein:
- side encapsulant surfaces of the encapsulant are aligned with package substrate side surfaces; and
- the encapsulant encases the second portions of the wire bonds.

3. The device of claim 2, wherein the encapsulant comprises a planar top encapsulant surface at about the top cover surface.

4. The device of claim 2, wherein the encapsulant comprises a non-planar top encapsulant surface having a peak encapsulant height at about the top cover surface.

5. The device of claim 1, wherein the cover adhesive film has inner and outer adhesive walls, the outer adhesive walls are aligned with edges of the protective cover.

6. The device of claim 5, wherein the cover adhesive film has a width defined between the inner and outer adhesive walls, the width is 200-250 um.

7. The device of claim 5, wherein the cover adhesive film has a height of 80-90 um.

8. The device of claim 1, wherein the outer adhesive walls of the cover adhesive film are aligned with side cover surfaces of the protective cover.

9. The device of claim 8 further comprises an encapsulant encapsulating the package substrate, exposed portions of the die, outer adhesive walls of the cover adhesive film and side cover surfaces of the protective cover.

10. The device of claim 9, wherein the encapsulant comprises a top encapsulant surface which is at about or below the top cover surface.

11. A method for forming a semiconductor package comprising:
- providing a planar package substrate having top and bottom major package substrate surfaces and side package substrate surfaces, the top major package surface includes a die attach region and package pads;
- attaching a die to the die attach region, wherein the die includes
  - a second major die surface, the second major die surface is attached to the die attach region, and
  - a first major die surface, the first major die surface includes
    - a sensor region,
    - a die cover attach region surrounding the sensor region, and
    - die pads disposed within the die cover attach region;
- bonding wire bonds to the die pads and package pads to electrically connect the die pads to the package pads;
- providing a protective cover having top and bottom cover surfaces separated by side cover surfaces, wherein the bottom cover surface includes a cap adhesive region at a periphery thereof, a cover footprint of the protective cover is smaller than a die footprint of the die, wherein the cap adhesive region comprises an adhesive film, wherein outer edges of the adhesive film are aligned with the cover side surfaces;
- attaching the protective cover with the cover adhesive film to the die by attaching the cover adhesive film onto the die cover attach region, wherein the cover adhesive film encases first portions of the wire bonds over the die cover attach region while leaving second portions of the wire bonds outside of the die cover attach region which are attached to package pads exposed, the protective cover and patterned adhesive film form a cavity over the sensor region.

12. The method of claim 11 further comprises encapsulating the package substrate with an encapsulant, wherein:
- the encapsulant encapsulating the package substrate and side cover surfaces of the protective cover:
- side encapsulant surfaces of the encapsulant are aligned with package substrate side surfaces; and
- the encapsulant encases the second portions of the wire bonds.

13. The method of claim 12, wherein:
- the package substrate comprises package contact pads disposed on the bottom package substrate surface, the package contact pads are electrically coupled to package pads on the top package substrate surface; and
- further comprises forming package contacts on the package contact pads.

14. The method of claim 11, wherein the cap adhesive region extends inwardly from side cover surfaces of the protective cover.

15. The method of claim 11, wherein:
- a top encapsulant surface comprises a planar top encapsulant surface; and
- the top encapsulant surface comprises a height at about the top cover surface.

16. The method of claim 11, wherein:
- a top encapsulant surface comprises a non-planar top encapsulant surface; and
- the top encapsulant surface comprises a peak encapsulant height at about the top cover surface.

17. The method of claim 11, wherein providing the protective cover comprises:
- providing a cover wafer with top and bottom cover wafer surfaces;
- attaching a patterned cover adhesive film on the bottom cover wafer surface, the patterned cover adhesive film having a plurality of apertures corresponding to inner edges of cap adhesive regions of a plurality of protective covers; and
- singulating the cover wafer to produce individual protective covers attached with the cover adhesive films.

18. The method of claim 17, wherein the protective covers outer adhesive walls of the cover adhesive films attached to the protective covers are aligned with side cover surfaces of the protective covers.

19. The method of claim 18 further comprises encapsulating the package substrate with an encapsulant, wherein:
- the encapsulant encapsulating the package substrate, exposed portions of the die, outer sidewalls of the cover adhesive film and sides of the protective cover:
- side encapsulant surfaces of the encapsulant are aligned with package substrate side surfaces; and
- the encapsulant encases the second portions of the wire bonds.

20. The method of claim 19, wherein the encapsulant comprises a top encapsulant surface which is at about or below the top cover surface.

* * * * *